United States Patent [19]

Kawamura et al.

[11] Patent Number: 5,189,501
[45] Date of Patent: Feb. 23, 1993

[54] ISOLATOR FOR ELECTRICALLY ISOLATING SEMICONDUCTOR DEVICES IN AN INTEGRATED CIRCUIT

[75] Inventors: Akio Kawamura, Nara; Katsuji Iguchi, Yamatokooriyama; Masahiko Urai, Nara, all of Japan

[73] Assignee: Sharp Kabushiki Kaisha, Osaka, Japan

[21] Appl. No.: 841,773

[22] Filed: Mar. 2, 1992

Related U.S. Application Data

[63] Continuation of Ser. No. 413,720, Sep. 28, 1989.

[30] Foreign Application Priority Data

Oct. 5, 1988 [JP] Japan ................... 63-251070

[51] Int. Cl.⁵ .......................................... H01L 27/12
[52] U.S. Cl. .................... 257/647; 257/649; 437/67
[58] Field of Search ............... 357/49, 47, 50, 23.11, 357/59 R

[56] References Cited

U.S. PATENT DOCUMENTS 4,907,063  3/1990  Okada et al. ................. 357/50

OTHER PUBLICATIONS

IBM Technical Disclosure Bulletin, vol. 23, No. 11, Apr., 1981, pp. 4917-4919, "Prevention of Birdsbeak Formation".
IBM Technical Disclosure Bulletin, vol. 24, No. 7B, Dec., 1981, pp. 3684-3688, "Improved Device Packing Density".

*Primary Examiner*—Paul M. Dzierzynski
*Assistant Examiner*—R. A. Ratliff

[57] ABSTRACT

An isolator for isolating semiconductor devices, components of an integrated circuit, on a semiconductor substrate, wherein the isolator is delimited by walls of a trench formed on a top surface of the semiconductor substrate, and the trench is filled with a silicon oxide layer deposited by a chemical vapor deposition method. A small ditch created in the middle of a top surface of the silicon oxide layer in the trench is filled with silicon, and at least a top surface of the silicon is thermally oxidized to form another silicon oxide layer.

2 Claims, 2 Drawing Sheets

ISOLATOR FOR ELECTRICALLY ISOLATING SEMICONDUCTOR DEVICES IN AN INTEGRATED CIRCUIT

This application is a continuation of application Ser. No. 07/413,720 filed Sep. 28, 1989, now abandoned.

BACKGROUND OF THE INVENTION

The present invention relates to an isolator for electrically isolating semiconductor devices, components of a semiconductor integrated circuit, from each other.

Memory capacities of Very Large Scale Integrations represented by DRAM (Dynamic Random Access Memory), SRAM (Static Random Access Memory), and so on, have been increasing to be four times as large every three years. The DRAMs mainly manufactured at present are of 256 Kb and of 1 Mb. DRAMs of 4 Mb and 16 Mb which will be mainly manufactured in the near future are being studied. It is easily forecast that the DRAMs will progress to have memory capacities of 64 Mb, and then, of 256 Mb.

Such increases in the packing density in a limited chip area have been realized by reduction in size of semiconductor devices consisting of a circuit or circuits. For example, the minimum size of MOS transistors used for a 1 Mb DRAM is about 1 $\mu$m at their largest at present, and the size will surely be made smaller to 0.5 $\mu$m, and then, to 0.25 $\mu$m. In addition to the reduced size of semiconductor devices, isolation regions positioned between the semiconductor devices on a chip are also related to the realization of the increase in the packing density. Specifically, a reduction of the isolation regions is indispensable to the increase in the packing density, and an isolation width comes to be required to be less than 1 $\mu$m, even to 0.5 $\mu$m at most.

Generally, the isolation regions are constructed of silicon dioxide which is formed in the following way by a selective oxidation method. Unmasked portions of a silicon nitride film covering a silicon substrate are etched away, and then, an exposed surface of the silicon substrate is selectively oxidized, thereby the silicon oxide which serves as an insulator is formed.

The selective oxidation method, however, has revealed the following problems as the semiconductor device regions and the isolation regions therebetween decrease. First, the oxidation of the silicon substrate during the selective oxidation process progresses even to regions covered with the silicon nitride film, and as a result, a silicon dioxide film called a bird's beak spreads. Therefore, there is a limit in the reduction of the isolation regions. Second, a long oxidation process time is required. Because of this, the silicon substrate suffers from stresses, and is flawed. As a result, characteristics of the semiconductor devices fabricated on the substrate deteriorate.

A trench-filling-up isolation method has been proposed as an alternative method of the selective oxidation method having the above problems. This new method consists of forming rectangular trenches in a silicon substrate and filling the trenches up with a silicon oxide layer or other layers. According to this method, only the trench regions are isolation regions serving as isolators. Therefore, the reduction of the isolation regions is possible. In addition, because this method has no thermal process over a long time, deterioration in the substrate characteristics is prevented.

The trench-filling-up method is an isolation method suitable for the fabrication of semiconductor integrated circuits of high packing density. However, this method has the following problems.

FIG. 9 is a schematic sectional view showing an isolation region formed by the above-described conventional trench-filling-up method. In FIG. 9, a reference numeral 20 designates a silicon substrate on which a trench 21 is formed by a reactive ion etching (RIE) method. A reference numeral 22 is a silicon dioxide layer which fills up the trench 21. The silicon oxide layer 22 is first grown by a CVD (Chemical Vapor Deposition) method and then processed to lead to the state as shown in FIG. 9. Disadvantageously, a very small ditch 23 is generated on the surface of the silicon dioxide layer in the trench 21 for the following reason. The silicon dioxide layer 22 for filling up the trench 21 grows not only on a bottom of the trench 21 but also on the sides thereof at almost same speed. Accordingly, in such a narrow trench as has a width "a" and a depth "b" the relationship between which is given by $$b > a/2,$$

silicon dioxide layers 22 growing from the opposite sides of the trench 21 collide with each other in the middle of the trench 21 and a junction 24 is formed to the depth of (b-a/2). The union of the silicon oxide layers 22 at the junction 24 is so weak that the silicon dioxide is easily etched along the junction 24 during a rinse process using a dilute hydrofluoric acid which is an indispensable process in the silicon semiconductor fabrication process, thus the small ditch generates.

Generally, formation of a gate insulator film and metalization for a gate electrode wiring for a MOS transistor follow the formation of the isolation regions. At this time, if small ditches exist in the isolation regions, cutting of the wiring takes place. In addition, if wiring materials remain in the small ditch, a short circuit takes place.

SUMMARY OF THE INVENTION

A principal object of the present invention is, therefore, to provide an isolator for isolating semiconductor devices in an integrated circuit, which isolator is suitable for the application to VLSI, wherein the problems inherent in the conventional trench-filling-up method are solved.

The above object is accomplished by filling a ditch created in a silicon oxide layer deposited by a CVD method in a trench delimiting an isolator with silicon, and then, thermally oxidizing at least a top surface of the silicon to form another silicon oxide layer over the ditch.

According to the present invention, a region occupied by the isolator is limited to a width of the trench formed on a top surface of a silicon substrate. Because of this, a lateral extension of the isolation region which is observed in the conventional selective oxidation process does not occur. This makes it easy to fabricate integrated circuits with high packing densities. The small ditch in the middle of the silicon oxide layer in the trench is filled up first with the silicon layer and then with the other silicon oxide layer which is formed by thermally oxidizing the silicon layer. Therefore, no further small ditches are produced in the processes using hydrofluoric acid. Thus, the cutting of the wiring on the isolator and a short-circuit can be well prevented and thereby the reliability and yield rate of semiconductor integrated circuits are improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

An embodiment of the present invention will be described in accordance with FIGS. 1 to 8 where a fabrication process flow of an isolator of the present embodiment is schematically illustrated. In this embodiment, an electron-beam lithography is used. Needless to say, other technologies can be used for lithography.

Figure 1:
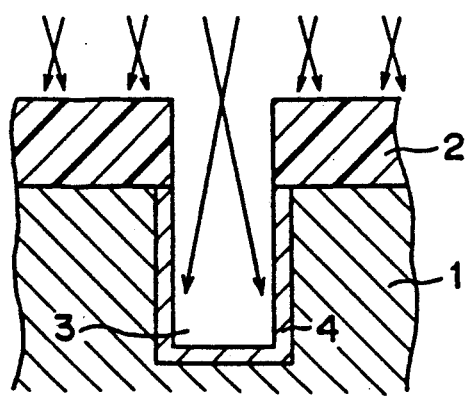
FIGS. 1 to 6, 7a, 7b, 8a and 8b illustrate a fabrication process of an isolator as an embodiment of the present invention.

Referring to FIG. 1, a reference numeral 2 designates a resist pattern which has been made by the electron-beam lithography. A p-type silicon substrate 1 is processed in a vertical direction by the RIE method with the resist pattern 2 being used as a mask, so that a trench 3 is etched in the substrate 1. Subsequently, using the resist pattern 2 as a mask, boron ions are obliquely emitted into the trench 3 by an ion implantation technology. In this way, p+ regions 4 are formed on the bottom and sides of the trench. This trench 3, which is 0.4 μm wide and 0.6 μm deep in this embodiment, delimits the isolator.

Next, after removing the resist, the top surface of the substrate is thermally oxidized so that a silicon dioxide layer 5 grows 10-50 nm on the walls of the trench 3. Subsequently, silicon nitride is deposited by a pressure-reduction CVD method to form a silicon nitride layer 6 on the order of 30-50 nm. Then, a further silicon dioxide layer 7 on the order of 0.6-1.0 μm is deposited on the silicon nitride layer 6 by a CVD method. A thinner silicon dioxide layer will be enough for the filling of the trench 3, though a wide trench requires a silicon dioxide layer of a thickness larger than a depth of the trench which is a minimum thickness. In order to obtain a smoother surface, it is preferable to form the silicon dioxide layer 7 as thick as possible.

Figure 4:
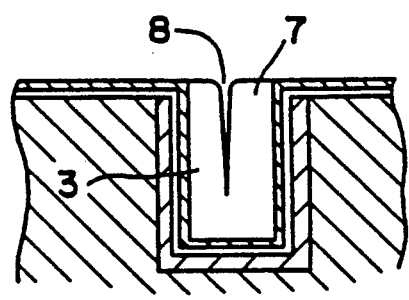
Figure 2:
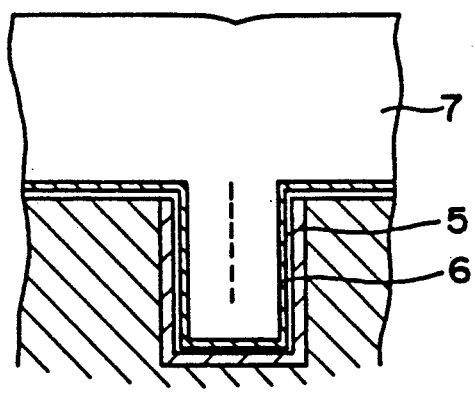
Figure 5:
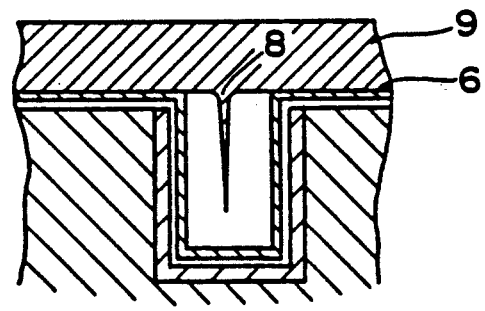
Figure 3:
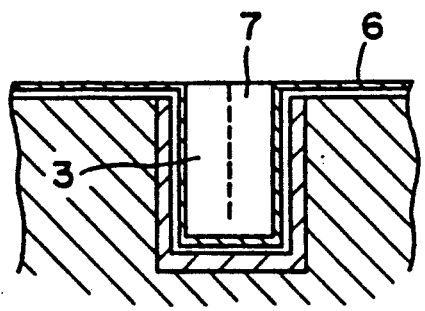
Figure 6:
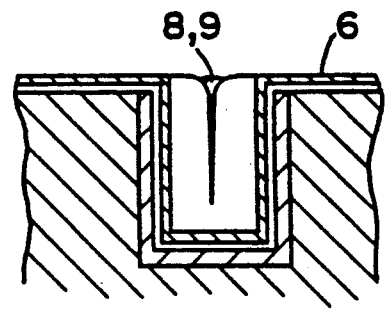
Figure 7A:
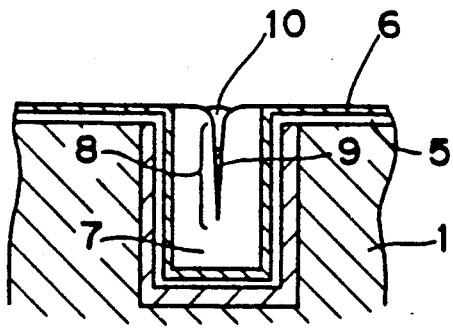
Figure 7B:
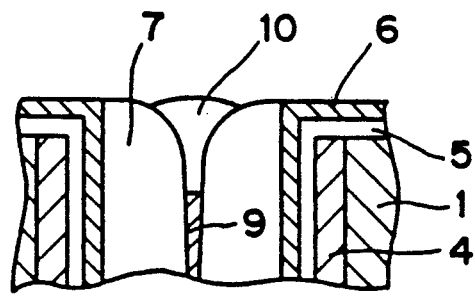

Next, resist (not shown) is spun on the silicon dioxide layer 7, so that an even surface is obtained. After that, the resist and silicon dioxide layer 7 are etched at the same speed by the RIE technique till the silicon nitride layer 6 is exposed. Consequently, a configuration as shown in FIG. 3 is obtained. Then, a remaining thin silicon dioxide film on the silicon nitride layer 6 is removed in a dilute hydrofluoric acid solution. At this time, a small ditch 8 is created on a surface of the silicon dioxide layer 7 in the middle of the trench 3, as shown in FIG. 4. This ditch 8 is filled with a polycrystalline silicon layer 9 which is deposited on the order of 1000-3000 Å through the use of the pressure-reduction CVD process, as shown in FIG. 5. Subsequently, etching is performed to remove the polycrystalline silicon layer 9 till the silicon nitride layer 6 is exposed, as shown in FIG. 6. As a result, the polycrystalline silicon 9 remains in the narrow ditch 8 as a filling. Then, the polycrystalline silicon 9 is thermally oxidated at its surface, so that a silicon dioxide layer 10 on the order of 1000-3000 Å is obtained, as shown in FIGS. 7a and 7b. At this time, lateral extension of an isolation region, which would be observed with the selective oxidation process, is not observed because the surface of the silicon substrate 1 and the walls of the trench 3 are covered with the silicon nitride layer 6. Some oxidation conditions will cause the polycrystalline silicon 9 to remain on the bottom of the small ditch 8. However, because the remaining polycrystalline silicon 9 is enclosed by the thick silicon dioxide layer 7, it does not cause a short circuit or works as a floating gate, thus never affecting the characteristics of peripheral devices.

Figure 8A:
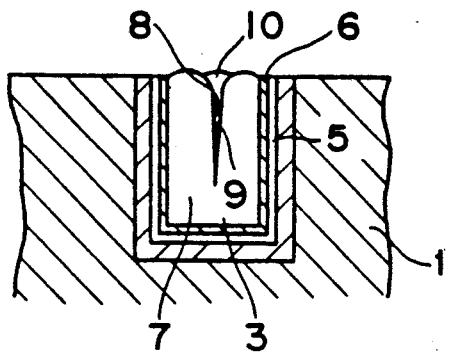
Figure 8B:
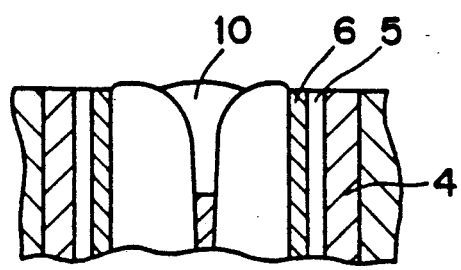
Figure 9:
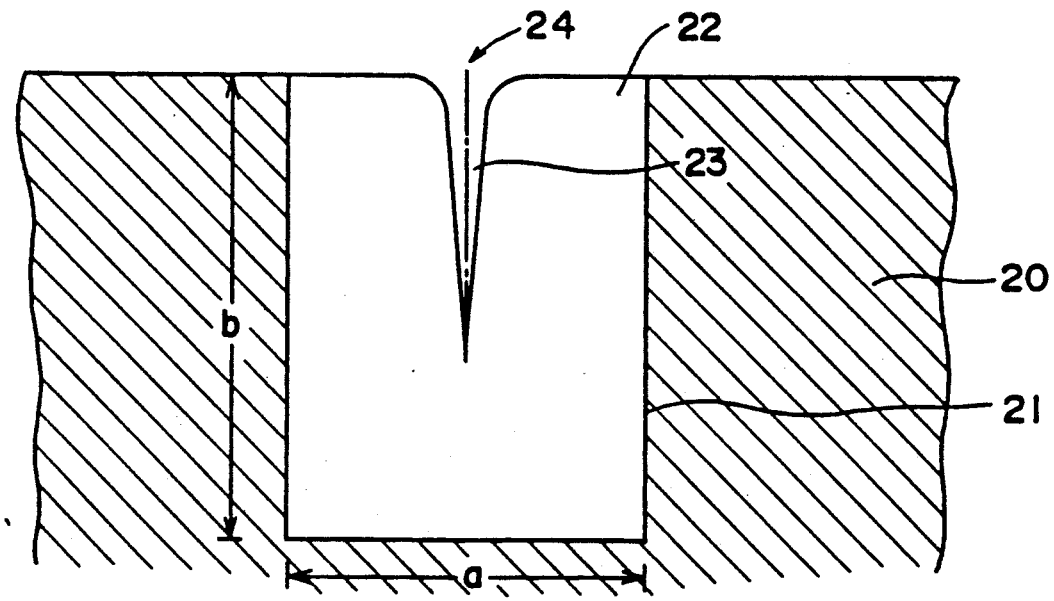
FIG. 9 is an explanatory illustration for showing the problems inherent in the prior art trench-filling-up isolation method.

Finally, removal of the silicon nitride layer 6 from the silicon substrate 1 through the use of the RIE technique and then removal of the silicon dioxide layer 5 in a dilute hydrofluoric acid solution are performed, as shown in FIGS. 8a and 8b. In this way, the formation of the isolator is completed.

Subsequently, devices such as MOS transistors are built in the silicon substrate 1 and fabrication of an integrated circuit or circuits having the built-in devices isolated by the isolators of the above structure is finished.

Actually, MOS transistors (not shown) having a channel length of 0.5 μm were fabricated, electrically isolated by the isolators as narrow as 0.4 μm in width which were fabricated in accordance with the above processes. Measurement of the transistors was made. The measurement result proved that the transistors had better characteristics, i.e., leakage currents were little, for example, as compared with transistors of the same dimensions, but isolated by isolation regions formed by the selective oxidation method. In addition, with respect to leak between devices caused by the parasitic MOS transistor effect, a threshold voltage to the leak was sufficiently high, which competed with transistors isolated by isolation regions formed by the selective oxidation method.

In addition to the above advantages, the isolators of the present embodiment, wherein a small ditch 8 created in the middle of the trench 5 on the silicon oxide layer 7 was filled with silicon 9, which was, in turn, thermally oxidized to form the silicon dioxide layer 10, had the following good effects.

First, further small ditches were not created through the dilute-hydrofluoric-acid treatments posterior to the completion of the isolators. As a result, cutting of the wiring over the isolators and a short circuit were prevented, thus, the yield rate and reliability of semiconductor integrated circuits were very much improved.

Second, because the silicon dioxide layer 10 formed over the trench 3 was obtained by thermally oxidizing the silicon 9 in the ditch, the silicon dioxide layer 10 was reduced very little and maintained a comparatively smooth top surface even after the wafer underwent the fabricating process of a semiconductor integrated circuit. This is because the thermally oxidized silicon has a larger resistance against a hydrofluoric acid solution, as compared with silicon dioxide deposited by the CVD method. The maintenance of a smooth surface of the isolator prevented the wiring from being cut and made a speedy device-fabrication process available and improved productivity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An isolator for isolating semiconductor devices in an integrated circuit on a semiconductor substrate comprising a trench of a predetermined depth and width formed on a top surface of the semiconductor substrate and having sidewalls, the trench is substantially filled wit ha silicon oxide layer grown by a chemical vapor deposition method,
- a silicon nitride layer in said trench is located between said sidewalls of said trench and said silicon oxide layer, and
- a small ditch created, by the use of a hydrofluoric acid to treat said silicon oxide layer, in the middle of a top surface of the silicon oxide layer in the trench is filled with a silicon layer, at least a top surface of which is thermally oxidized to form another silicon oxide layer, said small ditch extends from a top of said trench toward a bottom of said trench and has a wedge shape which has a wider width at the top of said trench, said width of said small ditch being the same width irrespective of said width of said trench.

2. A method of forming an isolator for isolating semiconductor devices in an integrated circuit on a semiconductor substrate comprising
- etching a trench having a predetermined width and depth in a semiconductor substrate surface,
- forming p+ regions on the bottom and sides of said trench
- growing a first silicon dioxide layer on said semiconductor surface including in said trench,
- depositing a second silicon dioxide layer on said silicon nitride layer and completely filling said trench with said second silicon dioxide layer,
- removing said second silicon dioxide layer from said silicon nitride layer except for a remaining thin film and except for that located in said trench,
- removing said thin film by treating it with a hydrofluoric acid,
- generating a small wedge-shaped ditch having a predetermined width and depth in said second silicon dioxide layer in the middle of said trench by said treating, said predetermined width of said small wedge-shaped ditch being the same width, irrespective of said width of said trench,
- depositing a polycrystalline silicon layer in said small ditch,
- oxidating said polycrystalline silicon layer so that a third silicon dioxide layer is obtained, and
- removing said silicon nitride layer and said first silicon dioxide layer from said semiconductor substrate surface except in said trench.

* * * * *